United States Patent
Rawat et al.

(10) Patent No.: US 12,525,945 B2
(45) Date of Patent: Jan. 13, 2026

(54) MEMS RESONATOR WITH TEMPERATURE COMPENSATION

(71) Applicant: TEXAS INSTRUMENTS INCORPORATED, Dallas, TX (US)

(72) Inventors: Udit Rawat, West Lafayette, IN (US); Bichoy Bahr, Alle, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 256 days.

(21) Appl. No.: 17/854,170

(22) Filed: Jun. 30, 2022

(65) Prior Publication Data

US 2024/0007078 A1    Jan. 4, 2024

(51) Int. Cl.
*H03H 9/02* (2006.01)
*H03H 9/24* (2006.01)

(52) U.S. Cl.
CPC ...... *H03H 9/02448* (2013.01); *H03H 9/2405* (2013.01)

(58) Field of Classification Search
CPC .......................... H03H 9/02448; H03H 9/2405
See application file for complete search history.

(56) References Cited

U.S. PATENT DOCUMENTS

| | | |
|---|---|---|
| 9,899,363 B1 | 2/2018 | Bahr et al. |
| 2019/0089263 A1 | 3/2019 | Granato et al. |
| 2020/0212532 A1* | 7/2020 | Gosavi ............... H01L 27/0218 |
| 2021/0099237 A1* | 4/2021 | Bahr .................... G01N 29/222 |

FOREIGN PATENT DOCUMENTS

EP    2499327 B1    3/2014

OTHER PUBLICATIONS

Ng, Eldwin J. et al. "Temperature Dependence of the Elastic Constants of Doped Silicon." Journal of Microelectromechanical Systems, vol. 24, No. 3, Jun. 2015. pp. 730-741.

Tabrizian, R. et al. "Temperature-Stable Silicon Oxide (SilOx) Micromechanical Resonators." IEEE Transactions on Electron Devices, vol. 60, No. 8, Aug. 2013. pp. 2656-2663.

Wang, Siping et al. "Temperature Coefficient of Frequency Modeling for CMOS-MEMS Bulk Mode Composite Resonators." IEEE Transactions on Ultrasonics, Ferroelectrics, and Frequency Control, vol. 62, No. 6, Jun. 2015. pp. 1166-1178.

* cited by examiner

*Primary Examiner* — Jeffrey M Shin

(74) *Attorney, Agent, or Firm* — Frank D. Cimino

(57) ABSTRACT

A microelectromechanical systems (MEMS) resonator includes a substrate, an array of ferroelectric capacitors on the substrate, and a three-dimensional metal stack above the array of ferroelectric capacitors. The three-dimensional metal stack may include more than two metal layers. Each of the metal layers is coupled to another of the metal layers by more than two metal vias.

29 Claims, 5 Drawing Sheets

MEMS RESONATOR WITH TEMPERATURE COMPENSATION

BACKGROUND

A resonator is a device or system that naturally oscillates at frequencies called resonant frequencies. Resonators can be, for example, crystal resonators (also known as quartz resonators), inductance-capacitance (LC) resonators, or microelectromechanical system (MEMS) resonators. Resonators are generally passive devices that are combined with active circuitry to create an oscillator. The oscillator produces a periodic signal at the resonant frequency. A crystal oscillator, for example, is an electronic circuit that uses the mechanical resonance of a vibrating crystal to create an electrical signal with a very precise frequency. Crystal oscillators may be used to generate frequencies to keep track of time or to generate a clock signal for digital integrated circuits. MEMS resonators may be used in place of crystal resonators to keep track of time and to generate a stable clock signal for analog and digital integrated circuits.

SUMMARY

In one example, a microelectromechanical system (MEMS) resonator includes a substrate, an array of ferroelectric capacitors on the substrate, and a three-dimensional metal stack above the array of ferroelectric capacitors.

In another example, a MEMS resonator includes a substrate, an array of ferroelectric capacitors, and a three-dimensional copper stack. The array of ferroelectric capacitors includes a first ferroelectric capacitor and a second ferroelectric capacitor. The first ferroelectric capacitor is on the substrate. The first ferroelectric capacitor includes a top plate. The second ferroelectric capacitor is on the substrate. The second ferroelectric capacitor includes a top plate. The three-dimensional copper stack is above the first ferroelectric capacitor and the second ferroelectric capacitor. The three-dimensional copper stack is electrically coupled to the top plate of the first ferroelectric capacitor and the top plate of the second ferroelectric capacitor.

In a further example, a MEMS resonator includes a substrate, a first ferroelectric capacitor, a second ferroelectric capacitor, and a three-dimensional copper stack. The first ferroelectric capacitor is on the substrate, and includes a top plate and a bottom plate. The second ferroelectric capacitor is on the substrate, and includes a top plate and a bottom plate. The bottom plate of the second ferroelectric capacitor is electrically coupled to the bottom plate of the first ferroelectric capacitor. The top plate of the second ferroelectric capacitor is electrically isolated from the top plate of the first ferroelectric capacitor. The three-dimensional copper stack is above the first ferroelectric capacitor and the second ferroelectric capacitor, and is electrically isolated from the top plate of the first ferroelectric capacitor and the top plate of the second ferroelectric capacitor.

DETAILED DESCRIPTION

The resonance frequency of solid-state unreleased microelectromechanical systems (MEMS) resonators integrated into standard complementary metal oxide semiconductor (CMOS) technology is highly temperature dependent. The dominant factor (aside from external package stress) in the temperature dependence is the silicon dioxide, or the back end of line (BEOL) dielectric, as its Young's Modulus exhibits strong dependence on temperature. For example, the Young's Modulus of silicon dioxide dielectric may increase with temperature on the order of 50-70 parts per million per degree Kelvin (ppm/K). This change in Young's modulus with temperature produces a strong positive temperature coefficient of frequency (TCF) in the MEMS resonator.

Various strategies have been employed to compensate TCF in MEMS resonators. A thin layer of silicon dioxide (having a positive temperature coefficient of Young's modulus (TCE)) may be added to a MEMS resonator having a negative TCE to counteract the positive TCE of the other layers of the circuit. Some silicon MEMS resonators add dopants, such as boron or arsenic, to the silicon to stabilize the TCF. Some MEMS resonators include columns of silicon dioxide inserted into the silicon substrate below the aluminum nitride of the resonator to compensate the aluminum nitride. These techniques may be complex, difficult to implement, and limited in application.

While the compensation techniques described above rely on keeping the resonance mode shape more or less the same, and introducing small amounts of material with a complementary characteristic, the unreleased MEMS resonators described herein implement a new resonator structure that changes the mode shape to extend the mode into the BEOL structure, allowing the mode to interact with copper metallization. The temperature coefficient of Young's modulus of copper is complementary to that of the BEOL dielectric. The MEMS resonators introduce copper metallization in the regions with the highest elastic energy concentration to achieve passive temperature compensation for the resonance frequency. The mode extension is achieved by extending the copper metallization to span higher metal layers available in CMOS integrated circuit technology.

Figure 1:
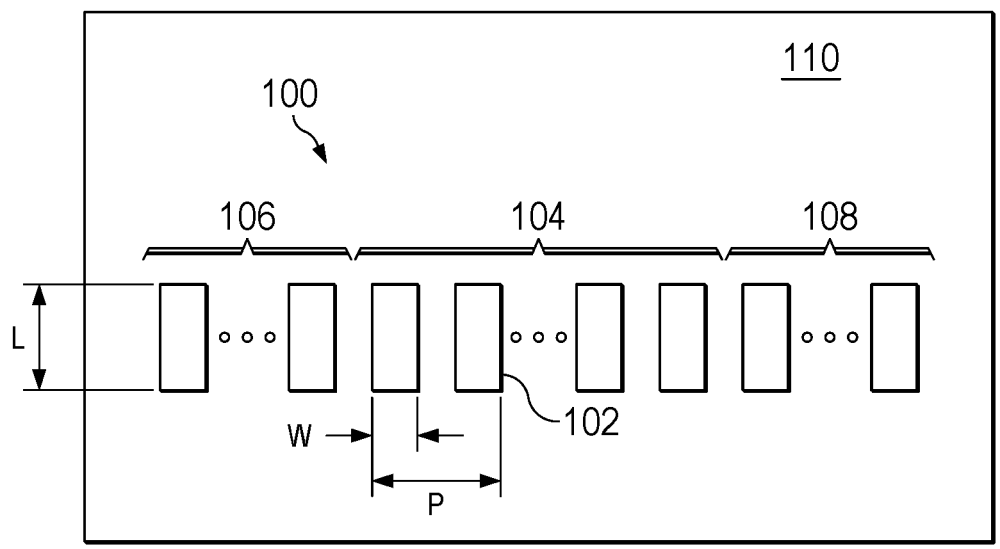
FIG. 1 is top view of an example capacitor array configured for use in an unreleased microelectromechanical system (MEMS) resonator.

FIG. 1 is top view of an example capacitor array 100 configured for use in an unreleased MEMS resonator. The capacitor array 100 may be fabricated on a silicon substrate 110 of a CMOS integrated circuit (IC). The capacitor array 100 includes multiple ferroelectric capacitors 102. The ferroelectric capacitors 102 can be used to generate stress and strain within the CMOS IC as part of resonator. A first portion 104 of the capacitor array 100 is arranged as a transducer array. A second portion 106 of the capacitor array 100, and a third portion 108 of the capacitor array 100 operate as termination arrays that reduce radiation loss from the transducer array formed by the first portion 104 of the capacitor array 100. In the second portion 106 of the capacitor array 100 and the third portion 108 of the capacitor array 100, the ferroelectric capacitors 102 are termination capacitors, and may not be connected to a signal or ground source. Each of the ferroelectric capacitors 102 has a width (w) and a length (L). The capacitor array 100 is arranged to have a pitch (p).

Figure 2:
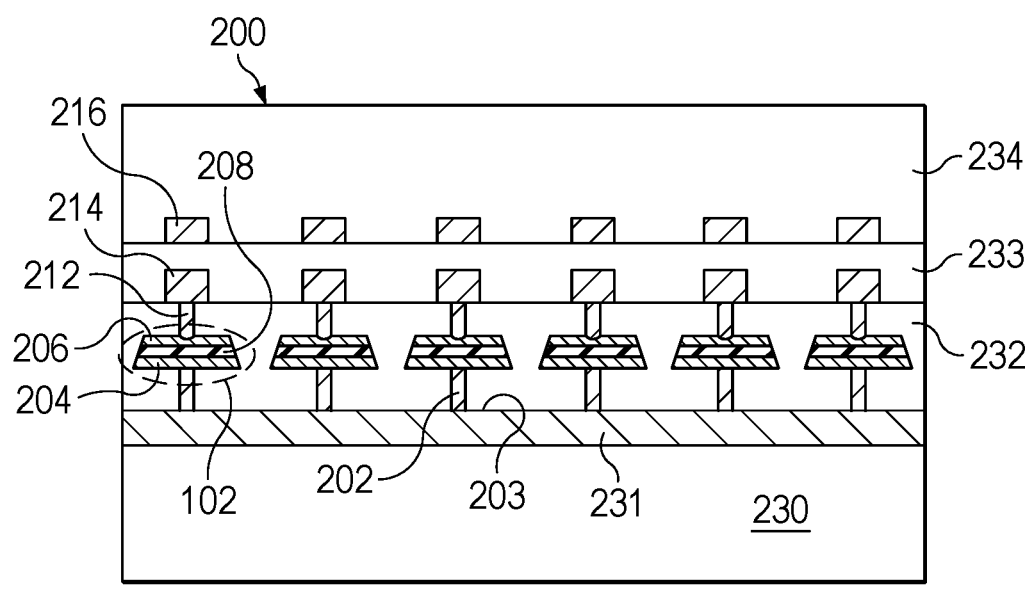
FIG. 2 is a side cross-sectional view of the capacitor array of FIG. 1.

FIG. 2 is a side cross-sectional view of portion of the capacitor array 100. Each ferroelectric capacitor 102 has a bottom plate 204 and a top plate 206 patterned from a conductive layer. Ferroelectric material 208 (e.g., lead zirconate titanate (PZT)) is sandwiched between the bottom plate 204 and the top plate 206 to form a capacitor. Via 202 connects a conductive signal line 203 to the bottom plate 204. Via 212 connects a contact 214 and thereby a conductive signal line 215 in a first metal layer to the top plate 206. A contact 216 in a second metal layer provides an additional signal routing layer that is interconnected with vias (not shown) to signal lines in the first metal layer.

On top of the silicon substrate 110, n+ and p+ wells are formed, providing a region for CMOS transistors implantation. In some implementations, the ferroelectric capacitors 102 may be formed on N-well layer 231 during the FEOL processing of the CMOS IC. Contacts 214, 216 and vias 212 are formed during BEOL processing of the CMOS IC. The silicon dioxide layers 232, 233, 234 provide electrical insulation around and between the first and second metal layers and contacts, such as contacts 214, 216. In other examples, various types of interconnect dielectric material layers may be used between multiple metal layers.

The ferroelectric capacitors 102 are fabricated during the FEOL processing of the CMOS IC. A first conductive layer that forms the bottom plates 204 may be deposited on substrate 200. The ferroelectric layer that forms the ferroelectric capacitors 102 is then deposited over the first conductive layer. A second conductive layer is then deposited over the ferroelectric layer. An etch process is then performed to form the individual plates of the ferroelectric capacitors 102. In another example, each layer may be patterned and etched individually. The first and second conductive layers that form the plates of the linear array of the 210 are a metallic alloy in this example.

The TCF of a MEMS resonator composed of a composite of different materials may be computed based on the TCE of each material weighted by the local strain energy density. See S. Wang, W-C Chen, B. Bahr, W. Fang, S-S Li and D. Weinstein, "Temperature coefficient of frequency modeling for CMOS-MEMS bulk mode composite resonators," IEEE TUFFC, vol. 62, no. 6, pp. 1166-1178, June 2015.

$$TCF = \frac{\int_\Omega TCE_i \cdot U_i^0 d\Omega}{2K^0} \quad (1)$$

where:
$K^0$ is the total kinetic energy of the resonator;
i represents the ith homogeneous domain of the resonator;
TCE is the temperature coefficient of Young's modulus of the homogeneous domain; and
$U^0$ is strain energy density.

Applying equation (1), an example MEMS resonator based on the capacitor array 100 may have TCF of about +85 ppm/K. A TCF value for each of various materials that may be applied to fabricate such a MEMS resonator (and used to compute the TCF of the MEMS resonator) is shown in Table 1.

TABLE 1

| Material | TCF (ppm/K) |
| --- | --- |
| SiO$_2$ | +68.95 |
| SI | −0.0395 |
| PZT | +27.09 |
| W | −0.52 |
| Ir | −0.868 |
| Poly-Si | −5.21 |
| Cu | −4.689 |

To reduce the TCF of the capacitor array 100, the MEMS resonators described herein, add a stack of interconnected copper layers above the capacitor array 100 during BEOL processing. The copper structure added to the MEMS resonator balances the elastic energy between SiO2 and copper to reduce the TCF of the MEMS resonator. In some implementations, the TCF of a MEMS resonator that includes a stack of interconnected copper layers above the capacitor array 100 may be zero, or near zero.

Figure 3:
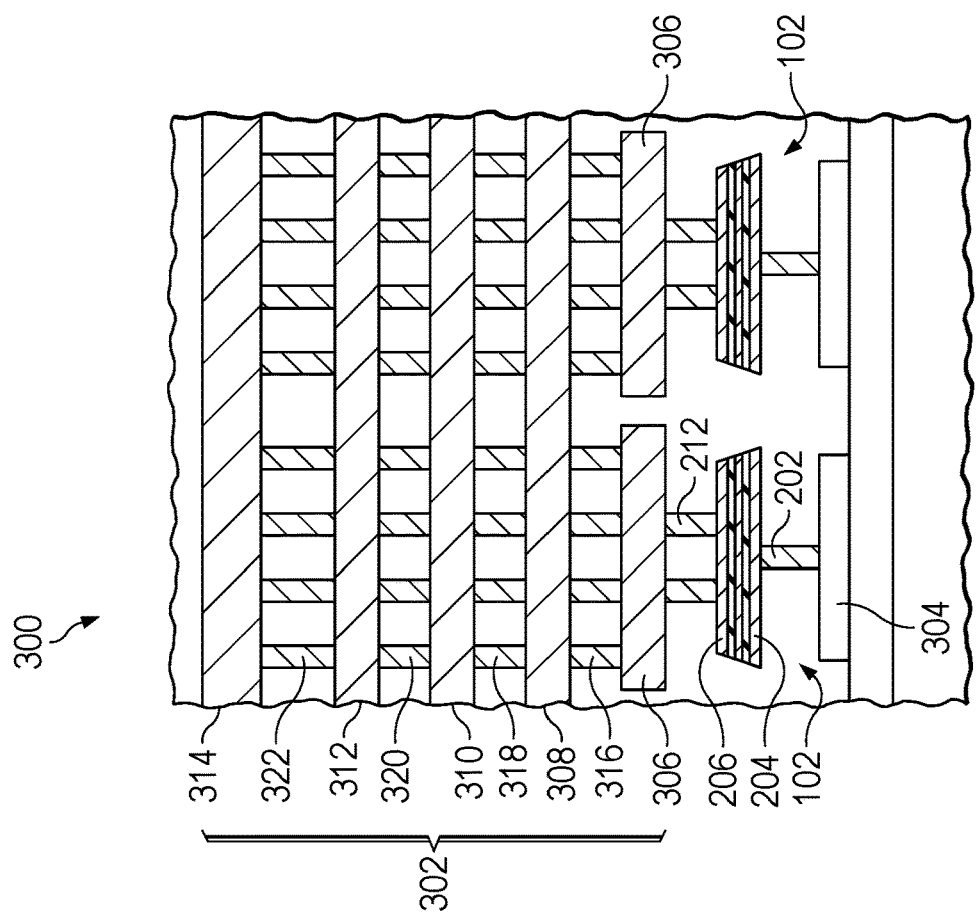
FIG. 3 is a cross-sectional view an example MEMS resonator that includes a metallic stack above the capacitor array to compensate the temperature coefficient of frequency (TCF) of the MEMS resonator.

FIG. 3 shows an example MEMS resonator 300 that includes a metallic stack above the ferroelectric capacitors 102 to compensate the TCF of the MEMS resonator. FIG. 3 shows two instances of the ferroelectric capacitors 102, and a stack 302 of interconnected copper layers (a three-dimensional metal stack) above the ferroelectric capacitors 102. Implementations of the MEMS resonator 300 may include more than two instances of the ferroelectric capacitors 102. The stack 302 includes copper layers 306, 308, 310, 312, and 314. While five layers of copper are illustrated as part of the stack 302 in FIG. 3, other examples of the stack 302 may include a different number of layers. The top plate 206 of the ferroelectric capacitor 102 is coupled to the copper layer 306 by the vias 212. The vias 212 may be a tungsten vias. The copper layer 306 is coupled to the copper layer 308 by vias 316. The copper layer 306 is discontinuous. No current flows between the ferroelectric capacitors 102 directly through the copper layer 306. The copper layer 308 is coupled to the copper layer 310 by vias 318. The copper layer 310 is coupled to the copper layer 312 by vias 320. The copper layer 312 is coupled to the copper layer 314 by vias 322. The vias 316, 318, 320, and 322 may be copper vias. The number of layers of copper, the thickness of the copper layers, and the spacing of the copper layers may be selected to compensate the TCF of the MEMS resonator (e.g., to make the TCF of the MEMS resonator zero, or reasonably close to zero). Similarly, the number of the vias, the diameter of the vias, and the spacing of the vias may be selected to optimize the TCF of the MEMS resonator. The inclusion of the stack 302 in the MEMS resonator 300 results in a TCF magnitude of less than 1 ppm/K.

In the MEMS resonator 300, the top plate 206 of the ferroelectric capacitors 102 are electrically coupled through the stack 302. The bottom plates 204 of the ferroelectric capacitors 102 are coupled to isolated sections of the layer 304 through vias 202. The layer 304 may be a polysilicon layer. Thus, in the MEMS resonator 300, the bottom plates 204 of the ferroelectric capacitors 102 are isolated and may be driven through the vias 202 coupled to the bottom plates 204.

Figure 4:
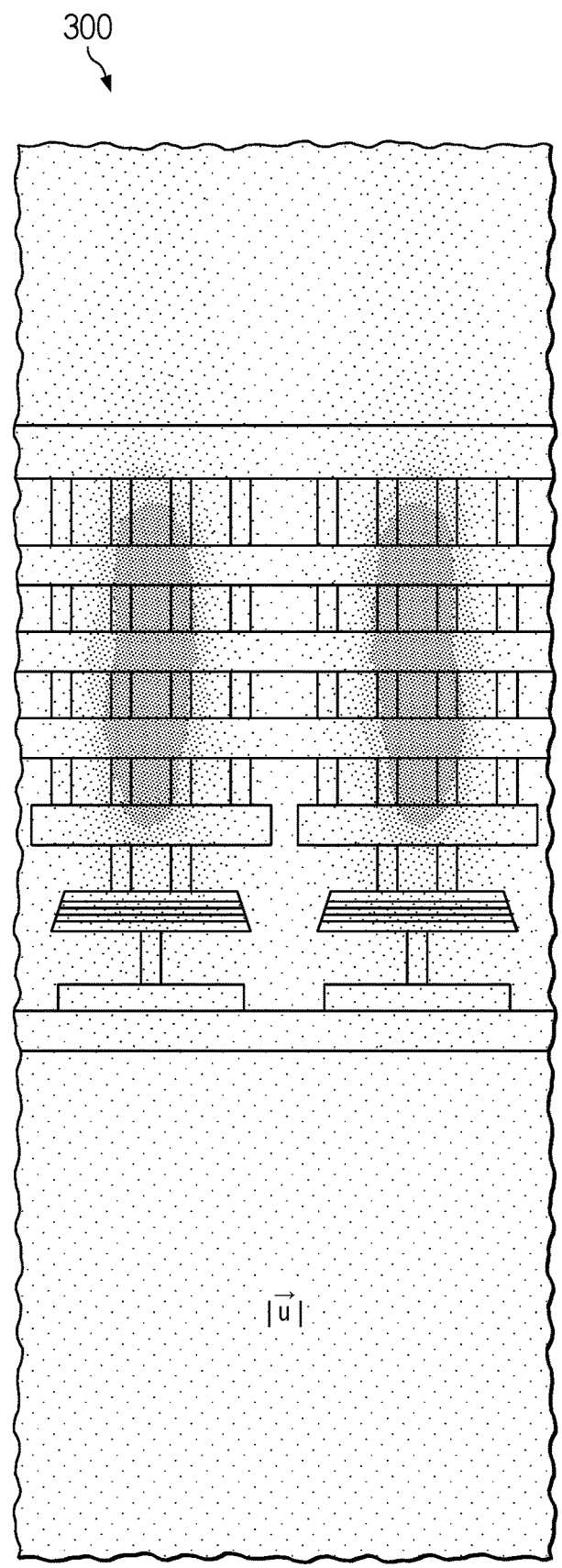
FIG. 4 shows example results of simulation of the displacement field of the localized mode of the MEMS resonator of FIG. 3.

FIG. 4 shows an example simulation of the displacement field of the localized mode of the ferroelectric capacitors 102 in the MEMS resonator 300. The localized mode interacts and extends into the stack 302 of copper layers to balance the TCF of the MEMS resonator 300.

Figure 5:
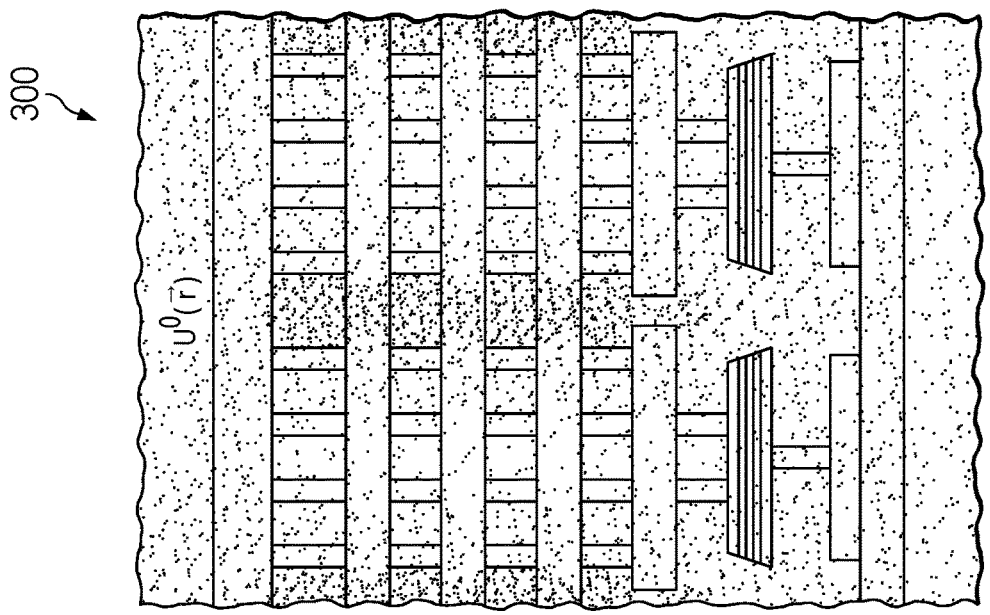
FIG. 5 shows example results of simulation of strain energy density in the MEMS resonator of FIG. 3.

FIG. 5 shows strain energy density in the MEMS resonator 300. The locations of strain energy may be used in conjunction with equation (1) to select the locations for additional copper metallization.

Figure 6:
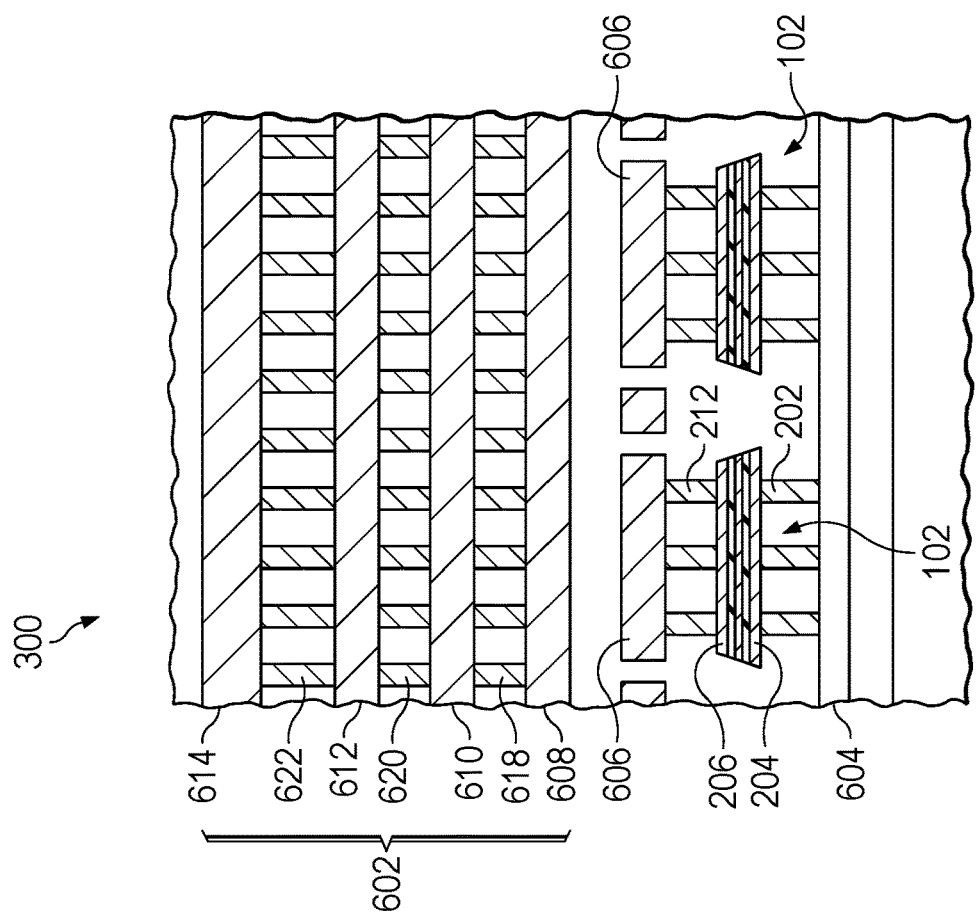
FIG. 6 is a cross-sectional view of another example MEMS resonator that includes a metallic stack above the capacitor array to compensate the TCF of the MEMS resonator.

FIG. 6 shows another example MEMS resonator 600 that includes a metallic stack above the ferroelectric capacitors 102 to compensate the TCF of the MEMS resonator. FIG. 6 shows two instances of the ferroelectric capacitors 102, and a stack 602 of interconnected copper layers above the ferroelectric capacitors 102. Implementations of the MEMS resonator 600 may include more than two instances of the ferroelectric capacitor 102. The stack 602 includes layers 608, 610, 612, and 614. While four layers of copper are illustrated as part of the stack 602 in FIG. 6, other examples of the stack 602 may include a different number of layers. The top plate 206 of the ferroelectric capacitor 102 is coupled to a copper segment 606 by the vias 212. The vias 212 may be tungsten vias. The copper segment 606 is electrically isolated from the stack 602. The copper layer 608 is coupled to the copper layer 610 by vias 618. The copper layer 610 is coupled to the copper layer 612 by vias 620. The copper layer 612 is coupled to the copper layer 614 by vias 622. The vias 618, 620, and 622 may be copper vias. The number of layers of copper, the thickness of the copper layers, and the spacing of the copper layers may be selected to compensate the TCF of the MEMS resonator (e.g., to make the TCF of the MEMS resonator zero, or reasonably close to zero). Similarly, the number of the vias, the diameter of the vias, and the spacing of the vias may be selected to optimize the TCF of the MEMS resonator. The inclusion of the stack 602 in the MEMS resonator 600 results in a TCF of less than 1 ppm/K.

In the MEMS resonator 600, the bottom plates 204 of the ferroelectric capacitors 102 are electrically coupled to the polysilicon layer 604 through the vias 202. The vias 202 may be tungsten vias. The bottom plates 204 of the ferroelectric capacitors 102 are electrically connected through the polysilicon layer 604. The top plates 206 of the ferroelectric capacitors 102 are coupled to isolated sections of the copper segment 606 through vias 212. Thus, in the MEMS resonator 600, the top plates 206 of the ferroelectric capacitors 102 are electrically isolated from one another, and from the stack 602, and may be driven through the vias 212.

In the MEMS resonator 300, the MEMS resonator 600, and other examples of a MEMS resonator that include a metallic stack to compensate TCF, the arrangement of the copper layers and the arrangement of the vias connecting the copper layers may be selected by analysis of energy density simulations. In the energy density simulations, regions with highest strain energy may be identified, as these are the regions with dominant impact on the TCF of the resonator. For example, if the TCF of the resonator is positive, the regions with the highest energy density are likely to be in the BEOL oxide. With identification of these regions, the copper vias and metallization may be moved to increase the elastic energy density in the copper, hence compensating the TCF of the resonator. Defining the metallization structure is an iterative process. With each change in the metallization, the mode shape changes, and therefore, multiple simulation iterations are performed to determine the metallization structure that compensates the TCF. TCF may be computed by simulating the structure at different temperatures, providing a result that is equivalent to using equation (1) and the TCE properties of the materials. Equation (1) may be applied to guide the movement of material needed to achieve a desired TCF.

Figure 7:
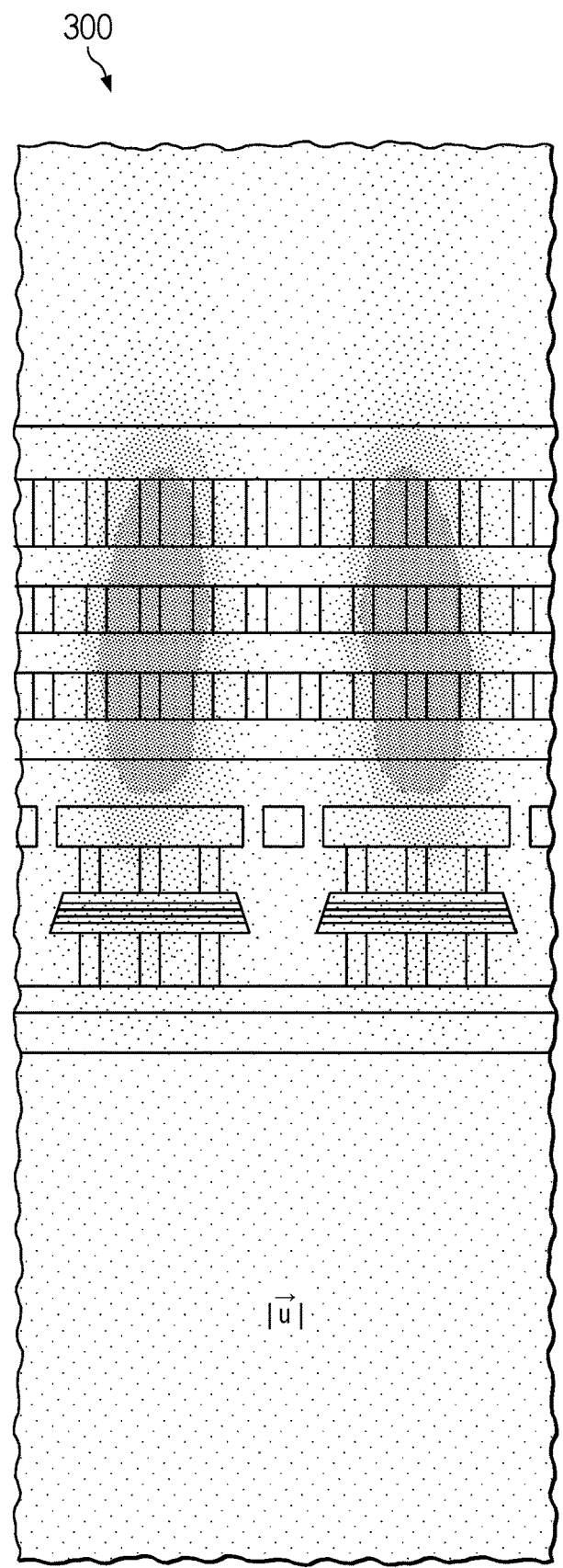
FIG. 7 shows example results of simulation of the displacement field of the localized mode of the MEMS resonator of FIG. 6.

FIG. 7 shows an example simulation of the displacement field of the localized mode of the ferroelectric capacitors 102 in the MEMS resonator 600. The localized mode interacts and extends into the stack 602 of copper layers to balance the TCF of the MEMS resonator 600.

Figure 8:
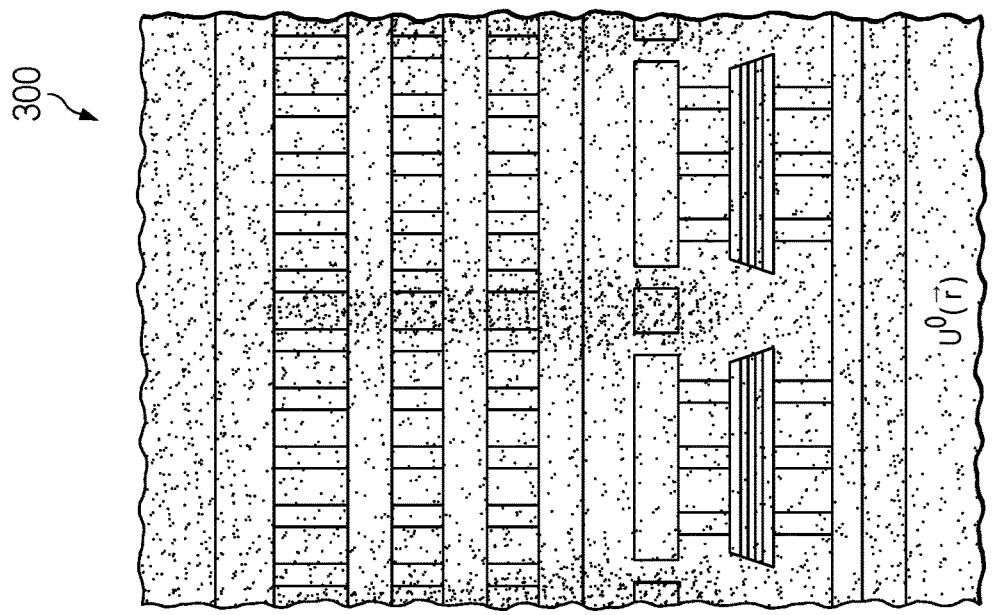
FIG. 8 shows example results of simulation of strain energy density in the MEMS resonator of FIG. 6.

FIG. 8 shows strain energy density in the MEMS resonator 600. The locations of strain energy may be used in conjunction with equation (1) to select the locations for additional copper metallization.

In this description, the term "couple" or "couples" may cover connections, communications, or signal paths that enable a functional relationship consistent with this description. For example, if device A generates a signal to control device B to perform an action: (a) in a first example, device A is coupled to device B; or (b) in a second example, device A is coupled to device B through intervening component C if intervening component C does not alter the functional relationship between device A and device B, such that device B is controlled by device A via the control signal generated by device A. Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter.

Modifications are possible in the described embodiments, and other embodiments are possible, within the scope of the claims.

What is claimed is:

1. An apparatus comprising:
   ferroelectric capacitors over a substrate; and
   a metal stack over the ferroelectric capacitors, the metal stack including a first metal layer, a second metal layer, and first and second metal vias coupled between the first and second metal layers, at least one of the first or second metal layers overlapping at least some of the ferroelectric capacitors.

2. The apparatus of claim 1, wherein:
   the metal stack includes more than two metal layers; and
   each of the metal layers is coupled to another of the metal layers by more than two metal vias.

3. The apparatus of claim 2, wherein the metal layers and the metal vias are copper.

4. The apparatus of claim 1, wherein:
   the metal stack is coupled to a top plate of a first ferroelectric capacitor of the ferroelectric capacitors and a top plate of a second ferroelectric capacitor of the ferroelectric capacitors; and
   a bottom plate of the first ferroelectric capacitor of the ferroelectric capacitors is coupled to a first layer over the substrate, a bottom plate of the second ferroelectric capacitor of the ferroelectric capacitors is coupled to a second layer over the substrate, and the first layer is spaced from the second layer.

5. The apparatus of claim 4, wherein:
   the metal stack is spaced from the ferroelectric capacitors; and
   a bottom plate of the first ferroelectric capacitor of the ferroelectric capacitors and a bottom plate of the second ferroelectric capacitor of the ferroelectric capacitors are coupled to a layer over the substrate.

6. The apparatus of claim 1, wherein the metal stack is configurable to balance elastic energy between the metal stack and silicon dioxide over the ferroelectric capacitors and around the metal stack.

7. The apparatus of claim 1, wherein the ferroelectric capacitors is part of a microelectromechanical systems (MEMS) resonator having a temperature coefficient of frequency (TCF) magnitude of less than 1 part per million per degree Kelvin.

8. The apparatus of claim 1, wherein each ferroelectric capacitor of the ferroelectric capacitors includes:
   a lead zirconate titanate dielectric between a conductive top plate and a conductive bottom plate of the ferroelectric capacitor.

9. The apparatus of claim 1, further comprising a layer of a dielectric material; wherein a temperature coefficient of frequency (TCF) of a metal of the metal stack is complementary to a TCF of the dielectric material.

10. The apparatus of claim 9, wherein the metal stack is in the layer of the dielectric material.

11. The apparatus of claim 1, wherein the ferroelectric capacitors are part of a MEMS resonator that is unreleased.

12. An apparatus comprising:
   ferroelectric capacitors including:
      a first ferroelectric capacitor, the first ferroelectric capacitor including a top plate;
      a second ferroelectric capacitor, the second ferroelectric capacitor including a top plate; and
   a stack of metal interconnects over the first ferroelectric capacitor and the second ferroelectric capacitor, the stack of metal interconnects including a first metal layer, a second metal layer, and first and second metal vias coupled between the first and second metal layers, at least one of the first or second metal layers overlapping the first and second ferroelectric capacitors.

13. The apparatus of claim 12, wherein:
   the stack of metal interconnects includes more than two metal layers; and
   each of the metal layers is coupled to another of the metal layers by more than two metal vias.

14. The apparatus of claim 12, wherein:
   the first ferroelectric capacitor includes a bottom plate coupled to a first layer over a substrate; and
   the second ferroelectric capacitor includes a bottom plate coupled to a second layer over the substrate, the first layer being spaced from the second layer.

15. The apparatus of claim 12, wherein the stack of metal interconnects is configurable to balance elastic energy between the stack of metal interconnects and silicon dioxide over the ferroelectric capacitors and around the stack of metal interconnects.

16. The apparatus of claim 12, wherein each ferroelectric capacitor of the ferroelectric capacitors include:
   a lead zirconate titanate dielectric between a conductive top plate and a conductive bottom plate of the ferroelectric capacitor.

17. The apparatus of claim 12, wherein:
   the first ferroelectric capacitor includes a bottom plate coupled to a layer over a substrate; and
   the second ferroelectric capacitor includes a bottom plate coupled to the layer over the substrate.

18. The apparatus of claim 12, wherein the stack of metal interconnects includes copper layers.

19. The apparatus of claim 12, wherein the ferroelectric capacitors are part of a MEMS resonator that is unreleased.

20. An apparatus comprising:
   a substrate;
   a first ferroelectric capacitor, including:
      a first top plate; and
      a first bottom plate;
   a second ferroelectric capacitor, including:
      a second bottom plate; and
      a second top plate; and
   a metal stack over the first top plate of the first ferroelectric capacitor and over the second top plate of the second ferroelectric capacitor, the metal stack including a first metal layer, a second metal layer, and first and second metal vias coupled between the first and second metal layers, at least one of the first or second metal layers overlapping the ferroelectric capacitors.

21. The apparatus of claim 20, wherein:
   the metal stack includes more than two metal layers; and
   each of the metal layers is coupled to another of the metal layers by more than two metal vias.

22. The apparatus of claim 20, wherein the metal stack is configurable to balance elastic energy between the metal stack and silicon dioxide around the metal stack.

23. The apparatus of claim 20, wherein each ferroelectric capacitor of the first and second ferroelectric capacitors includes:
   a lead zirconate titanate dielectric between a conductive top plate and a conductive bottom plate of the ferroelectric capacitor.

24. The apparatus of claim 20, wherein the first and second bottom plates are coupled to a layer over the substrate.

25. The apparatus of claim 20, wherein the first bottom plate is coupled to a first layer over the substrate, the second bottom plate is coupled to a second layer over the substrate, the first layer being spaced from the second layer.

26. The apparatus of claim 20, wherein the first and second top plates are coupled to the metal stack.

27. The apparatus of claim 20, wherein the first and second top plates are spaced from the metal stack.

28. The apparatus of claim 20, wherein the metal stack includes copper layers.

29. The apparatus of claim 20, wherein the first and second ferroelectric capacitors are part of a MEMS resonator that is unreleased.

* * * * *